(12) United States Patent
Rodriguez et al.

(10) Patent No.: US 9,386,730 B2
(45) Date of Patent: Jul. 5, 2016

(54) MODULAR POWER ELECTRONICS DISTRIBUTION SYSTEM

(71) Applicant: Rolls-Royce Corporation, Indianapolis, IN (US)

(72) Inventors: Rigoberto J. Rodriguez, Avon, IN (US); William L. Siegel, Mercersburg, PA (US); Eric D. Schneider, Carmel, IN (US); Paul Rancuret, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 49 days.

(21) Appl. No.: 14/546,255

(22) Filed: Nov. 18, 2014

(65) Prior Publication Data

US 2015/0173254 A1      Jun. 18, 2015

Related U.S. Application Data

(60) Provisional application No. 61/915,899, filed on Dec. 13, 2013.

(51) Int. Cl.
*H05K 7/20* (2006.01)
*F02C 9/00* (2006.01)
*H02J 4/00* (2006.01)

(52) U.S. Cl.
CPC .............. *H05K 7/20927* (2013.01); *F02C 9/00* (2013.01); *H02J 4/00* (2013.01)

(58) Field of Classification Search
CPC .. H05K 7/20927; H05K 7/20218; F02C 9/00; H02J 4/00

USPC ......................................... 361/600–678, 699
See application file for complete search history.

(56) References Cited

U.S. PATENT DOCUMENTS

| | | | |
|---|---|---|---|
| 4,064,630 A * | 12/1977 | Killick | A61C 1/0015 |
| | | | 433/98 |
| 5,466,974 A | 11/1995 | Sutrina et al. | |
| 6,215,658 B1 | 4/2001 | Bodini | |
| 7,046,513 B2 | 5/2006 | Nishiyama et al. | |
| 7,671,490 B2 | 3/2010 | Hartung et al. | |
| 7,907,423 B2 | 3/2011 | Lopes et al. | |

(Continued)

FOREIGN PATENT DOCUMENTS

EP      2077226 A2      7/2009

OTHER PUBLICATIONS

Search Report for EP Application No. 14196020.3, dated Apr. 29, 2015, 3 pages.

*Primary Examiner* — Zachary M Pape
(74) *Attorney, Agent, or Firm* — Fishman Stewart PLLC (57) ABSTRACT

A turbine engine may include a modular power electronics distribution system having a plurality of modules connectable to a pluggable interface. The pluggable interface may be configured to receive and distribute power to the plurality of modules. Each module may include at least one fault isolation switch and a coolant system including an inlet and return line, as well as a metering valve. At least one power bus may be configured to provide electrical power to at least one of a load or a source via a functional segment. The functional segment may be operable to supply electrical power to the load in a desired form. The modular power electronics distribution system may include a controller in communication with the plurality of modules, the controller configured to control at least one fault isolation switch and metering valve.

20 Claims, 4 Drawing Sheets

(56) References Cited

U.S. PATENT DOCUMENTS

| | | |
|---|---|---|
| 8,148,842 B2 | 4/2012 | Maier |
| 2004/0069251 A1 | 4/2004 | Rzadki |
| 2013/0077279 A1 | 3/2013 | Tomasi et al. |
| 2013/0082520 A1 | 4/2013 | Leemans et al. |
| 2013/0099565 A1* | 4/2013 | Sachs ........................ H02J 3/46 307/25 |
| 2014/0029167 A1* | 1/2014 | Degli Innocenti . H01H 71/0271 361/615 |

\* cited by examiner

MODULAR POWER ELECTRONICS DISTRIBUTION SYSTEM

CROSS-REFERENCE TO RELATED APPLICATIONS

This application claims priority to U.S. Provisional Patent Application No. 61/915,899 filed Dec. 13, 2013, the contents of which are hereby incorporated in their entirety.

FIELD OF TECHNOLOGY

An improved integrated design and control of a gas turbine is disclosed. More particularly, performance and efficiency are improved by optimizing size and usage of components of a gas turbine, the components including propulsion, thermal, electrical, and control systems, as examples. The improvements are applicable to turbines used for propulsive power in marine, land, air, and underwater applications, as examples.

BACKGROUND

It has become increasingly desirable to improve the overall system design and operation of gas turbines. In a system having a typical gas turbine engine, electrical power is extracted via an electrical generator to supply electrical power to control systems, actuators, weapons systems, climate control systems, and the like. Electrical storage, such as a battery, is typically provided to operate such systems when the gas turbine engine is not running or to provide power for starting the gas turbine engine. In some known gas turbine engines, the gas turbine engine includes a high pressure shaft and a lower pressure shaft, and the electrical generator is coupled to one of the high and low pressure shafts.

However, extraction of power from the gas turbine engine via one of the shafts itself typically results in a loss in overall system life, and in particular to the components of the engine to which the electrical generator is coupled.

Overcoming these concerns would be desirable and could save the industry substantial resources.

BRIEF DESCRIPTION OF THE DRAWINGS

While the claims are not limited to a specific illustration, an appreciation of the various aspects is best gained through a discussion of various examples thereof. Referring now to the drawings, exemplary illustrations are shown in detail. Although the drawings represent the illustrations, the drawings are not necessarily to scale and certain features may be exaggerated to better illustrate and explain an innovative aspect of an example. Further, the exemplary illustrations described herein are not intended to be exhaustive or otherwise limiting or restricted to the precise form and configuration shown in the drawings and disclosed in the following detailed description. Exemplary illustrations are described in detail by referring to the drawings as follows:

DETAILED DESCRIPTION

An exemplary gas turbine engine and schematic of an electrical system coupled thereto are described herein and are shown in the attached drawings. The electrical system includes at least two generator circuits, one coupled to a high pressure portion of a gas turbine engine and the other coupled to a low pressure portion of the gas turbine engine.

Figure 1:
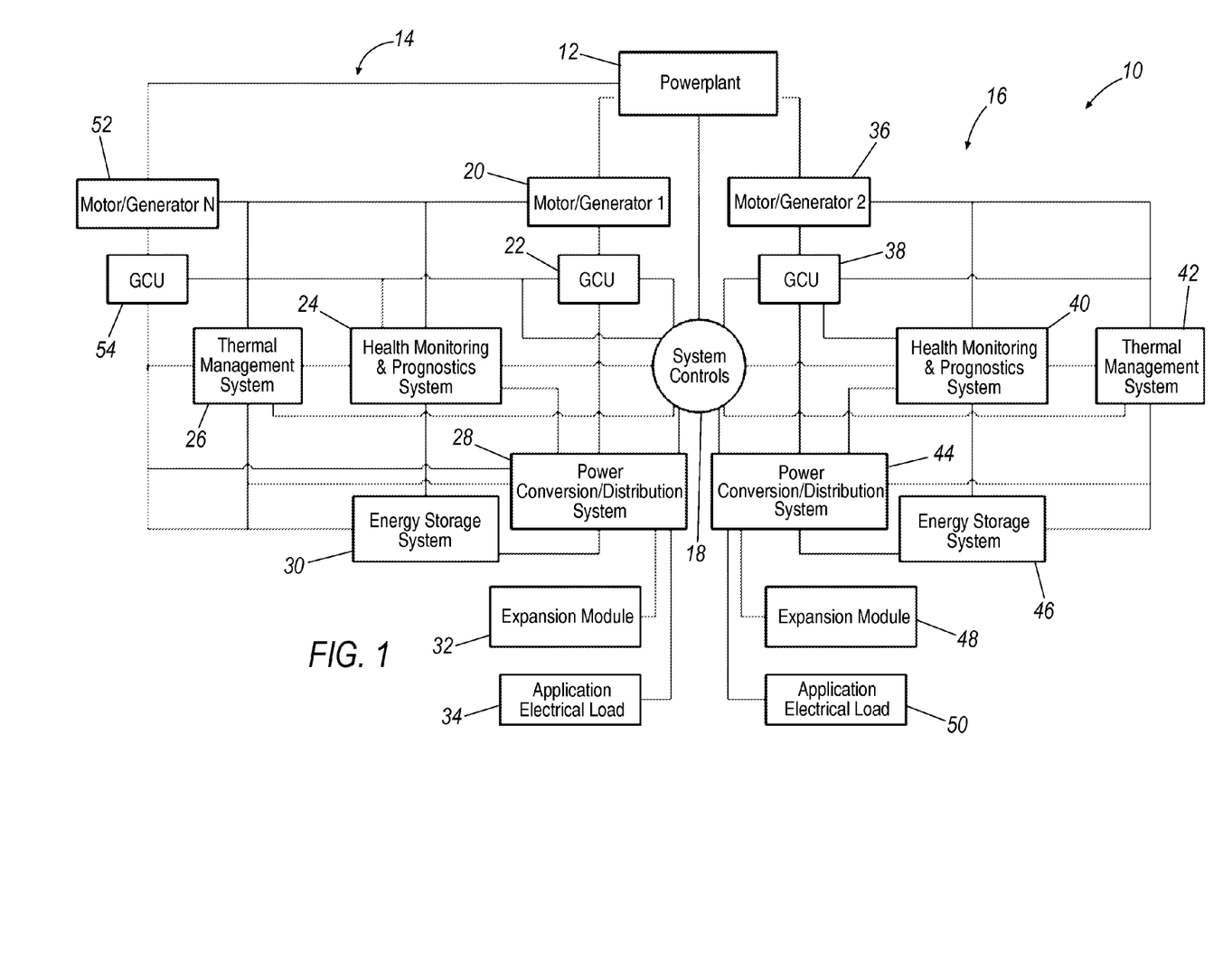
FIG. 1 is a schematic illustration of an electrical system coupled to a gas turbine engine, according to one example.

FIG. 1 illustrates an electrical system 10 in which a power plant or engine 12, such as a gas turbine engine, provides electrical power to a first power circuit 14 and a second power circuit 16. A system controller 18 is coupled to engine 12 and also to first and second circuits 14, 16. First power circuit 14 includes a motor/generator 20 and a General Control Unit (GCU) 22 coupled thereto. GCU 22 is also coupled to other components within first power circuit 14, such as a health monitoring and prognostics system 24, a thermal management system 26, and a power conversion/distribution system 28. First power circuit 14 also includes an energy storage system 30, an expansion module 32, and application electrical load(s) 34. System controller 18 is configured to regulate power flow (such as electrical currents and voltages within system 10) to provide power to various electrical busses. The power may be DC, AC, or conversion therebetween. System controller 18 may also be configured to execute computer program instructions to control the operation of engine 12, including fuel flow, or the position of any variable geometry systems (e.g., from the flight control system of an aircraft or from a steering system of a ship).

Health monitoring and prognostics system 24 is generally a unit that monitors the health of system components, and may be used to estimate component life based on sensor feedback received from components within engine 12. Thermal management system 26 includes pumps, expansion valves, and the like, as well as a controller, to provide coolant for the purposes of climate control, and other system operations. Power conversion/distribution system 28 receives electrical power from motor/generator 20 via GCU 22, and converts the power to a more useable form such as a DC voltage for storage in energy storage system 30, expansion module 32, and application electrical load(s) 34. The energy storage system 30 may include a battery or other energy storage system. Energy storage system 30 stores energy for providing power when engine 12 is not running (i.e., not generating power), but also to provide power to motor/generator 20 to provide starting power to engine 12 during startup. Expansion module 32 and application electrical load 34 represent additional electrical components that receive power from power conversion/distribution system 28.

Second power circuit 16 similarly includes a motor/generator 36 and a GCU 38 coupled thereto. GCU 38 is also coupled to other components within second power circuit 16, such as a health monitoring and prognostics system 40, a thermal management system 42, and a power conversion/distribution system 44. Second power circuit 16 also includes an energy storage system 46, an expansion module 48, and application electrical load(s) 50. The components 36-50 of second power circuit 16 are similarly arranged as described with respect to first power circuit 14. Additionally, in one example electrical system 10 includes one or more additional motor/generators 52 and corresponding GCUs 54 as well, which may be coupled to a gas turbine engine as will be further described. Thus, the system 10 is modular and flexible in that it may be expanded to include a number N of motor/generators based on contemplated operating conditions.

Figure 2:
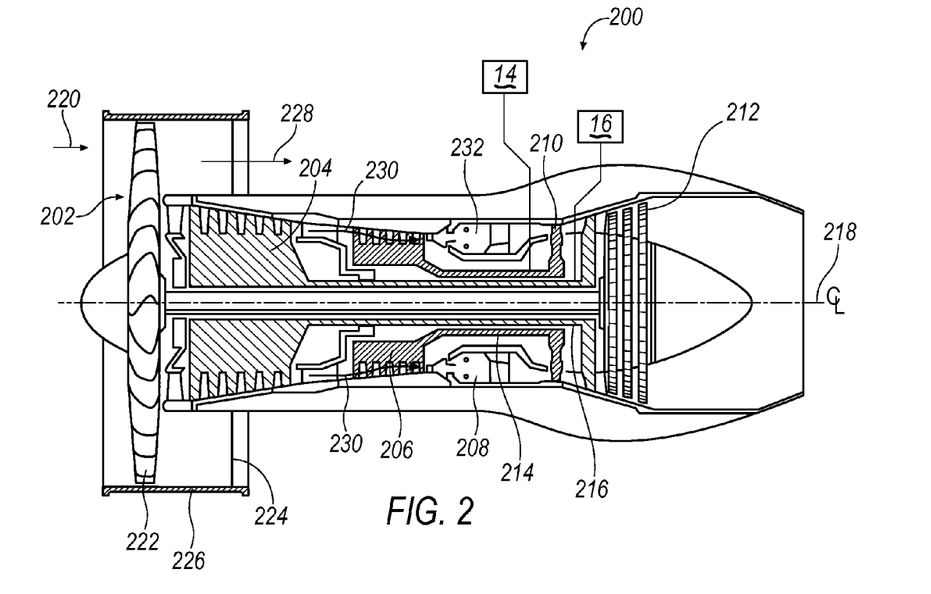
FIG. 2 illustrates an exemplary gas turbine engine that incorporates the electrical system illustrated in FIG. 1.

FIG. 2 illustrates a gas turbine engine 200, which includes a fan 202, a low pressure compressor and a high pressure compressor, 204 and 206, a combustor 208, and a high pressure turbine and low pressure turbine, 210 and 212, respectively. The high pressure compressor 206 is connected to a first rotor shaft 214 while the low pressure compressor 204 is connected to a second rotor shaft 216. The shafts extend axially and are parallel to a longitudinal center line axis 218. Ambient air 220 enters the fan 202 and is directed across a fan rotor 222 in an annular duct 224, which in part is circumscribed by fan case 226. Bypass airflow 228 provides engine thrust while a primary gas stream 230 is directed to a combustor 232 and the high pressure turbine 210.

First and second rotor shafts 214, 216, are coupled, respectively, to first and second power circuits 14, 16, as illustrated in FIG. 1. Thus, first and second power circuits 14, 16 are configured to split power between motor/generators 20, 36 so that each provides a portion of the power demand. As such, a power sharing/transfer arrangement between motor/generators 20, 36 provides the platform power demand, and includes a capability to provide power to one of the shafts 214, 216, as necessary. Such arrangement also provides an ability to optimize load shedding and a demand side management of the power requirement. Thus, life and performance considerations may be taken into account in real-time and optimized to actively seek and obtain performance optima while equipment is in operation.

Figure 3A:
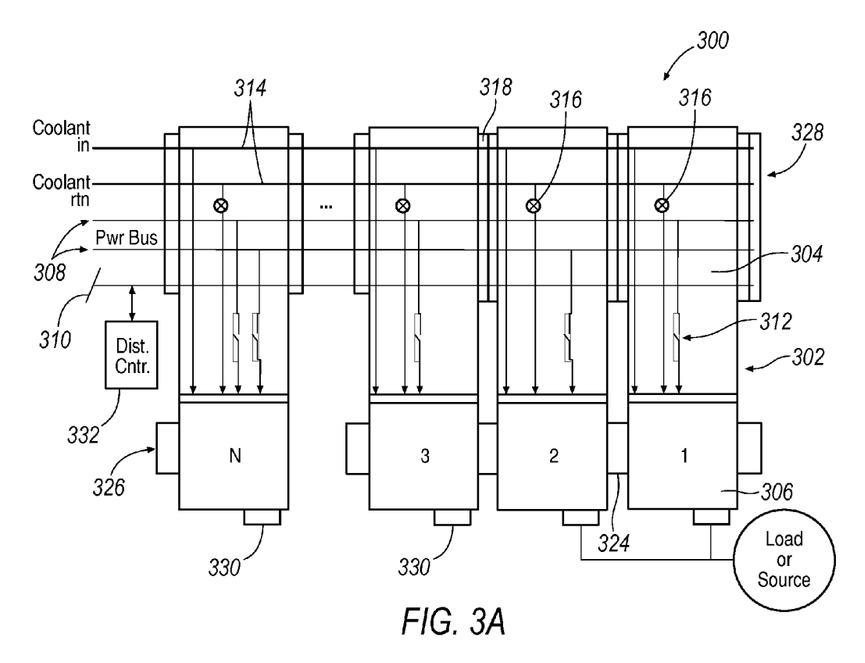
FIG. 3A illustrates a modular power electronics distribution system according to one example.
Figure 3B:
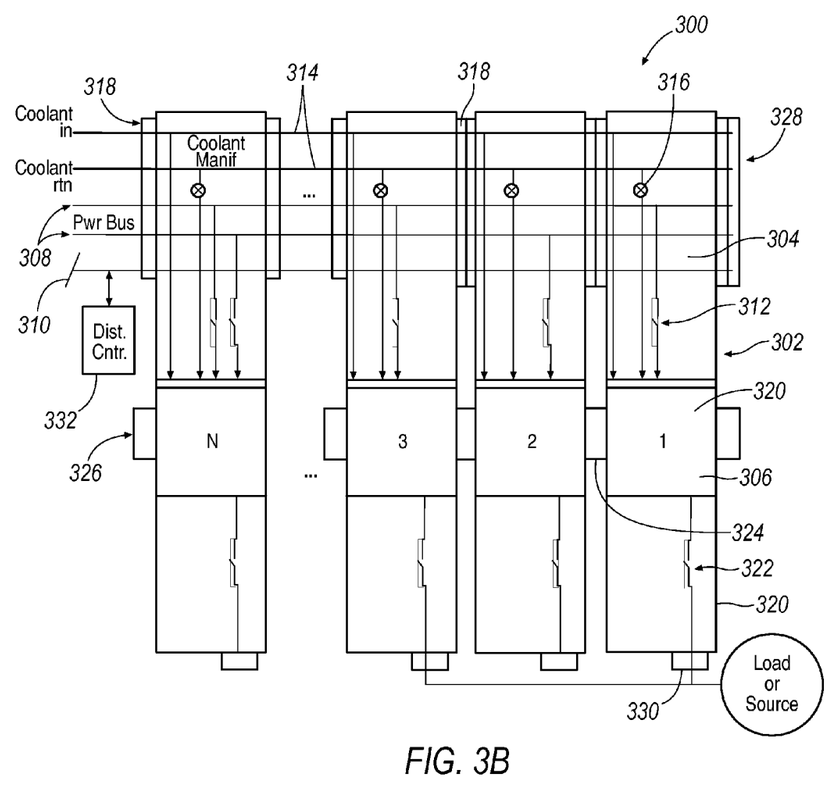
FIG. 3B illustrates a modular power electronics distribution system according to another example.

FIGS. 3A and 3B illustrate a modular power electronics distribution system 300. The system 300 may be incorporated into power conversion/distribution systems 28, 44 of the electrical system 10. The modular power electronics distribution system 300 may be associated with various electrical systems and components in an aircraft, ship, train, laboratory facility, etc. The system 300 may be configured to receive various power inputs, for example input form motor/generators 20, 26 and energy storage systems 30, 46. The modular power electronics distribution system 300 may be operable to convert the power input into an appropriate electrical power for various loads and/or sources, including but not limited to an air conditioning system, weapon system, navigation system, cabin air compressor, braking system, starter generators, ground power carts, etc.

The modular power electrical distribution system 300 may include modules 302 comprising both common and functional components 304, 306. Traditional distribution designs generally use a backplane approach where the backplane (e.g., distribution box or cabinet) contains all the hardware common in the system and the individual modules contain only the equipment performing a single function assigned to that module. For example, individual converter boxes (e.g., a dedicated DC-DC converter from 270 V to 28V) connected with the distribution box containing common hardware, such as the bus, wiring, and cooling system. Each converter box connected to the distribution box through a similar interface method, such as wires or a backplane which could be found in a rack mounting scheme. The distribution box was generally designed as an enclosure which needed to be sized to accommodate the maximum possible number of converter boxes in the system, which could vary from system to system. The modular power electrical distribution system 300, however, segments the "common" hardware and adds a functional segment to each module such that, when mated the collection/plurality of modules contain both functional as well as common hardware. Accordingly, lighter and more efficient units may be built due to the shared/common hardware. In like manner, duplicability is easily achieved allowing malfunctioning modules to be conveniently removed and replaced.

FIG. 3A illustrates one example of the modular power electronics distribution system 300. The system 300 may include a plurality of modules 302, each including a common segment 304 in communication with a functional segment 306. The common segment 304 may include the backplane elements such as a power bus network 308, which may include one or more buses 308, wiring circuitry (not shown), and electrical filters (not shown) configured to perform signal processing (e.g., to reduce AC or DC ripple). Likewise, the common segment 304 may include the communication and low power/voltage harnesses 310 configured to transmit commands to the functional segment 306. Fault isolation circuitry 312, such as electronic breakers and switches, may be included to protect the module 302 from power surges. For example, if the electrical current exceeds a predefined threshold, the fault isolation circuitry 312 may trip and disconnect the module 302 from a load. If a module 302 includes more than one power bus 308, each may include fault isolation circuitry 312. Additionally, the common segment 304 may include cooling system 314 including coolant inlet and return lines that may provide coolant to the functional segment 306 as well as a metering and cutoff valve 316 which monitor the flow of coolant.

The components of the common segment 304 may be electrically and thermally coupled to the functional segment 306. The functional segment 306 may provide electrical power in the required form to various loads and/or sources. A non-exhaustive exemplary list of actions the function segment 306 may be operable to perform may include a DC-DC converter providing uni-directional power, a DC-DC converter providing bi-directional power, DC-AC inverter, AC-DC rectifier, or a bi-directional DC-AC inverter/rectifier. Thus, for example, the module 302 may be configured to provide power for a 28 V DC load, 400 Hz loads, High Frequency loads, supply 115 V three-phase power to AC loads, provide power to motor/generator 20, 36, hydraulic loads, merely as examples. Accordingly, unlike traditional power conversion systems which use dedicated converters and controllers to provide power to loads, the modular power electronics distribution system 300 may provide integrated distribution of power to various loads.

With reference to FIG. 3B, exemplary modular power electrical distribution system 300 is illustrated according to another example. The system 300 may include all the elements incorporated into FIG. 3A, but may further include a second common hardware segment 320 on the load or source side of the functional element 306. Segment 320 may include the elements associated with common segment 304, including a second fault isolation circuitry 322. As such, the faulty functional segment 306 may be isolated on both sides of the functional segment 306 near the source of the fault.

Referring to FIGS. 3A and 3B, the plurality of modules 302 may be interconnected through a pluggable interface 318. The interface 318 may include a standard interface such that modules 302 may be freely switched or exchanged with one another, thereby allowing the modular power electrical distribution system 300 to be customized to the electrical load and/or source configuration of the associated electrical system. Additionally, the pluggable interface 318 enables any number of modules 302 to be stacked or mated in the system 300, as illustrated in FIGS. 3A and 3B as module N, as the number of modules 302 is not limited to the size of a cabinet/enclosure. Interface 318 may facilitate transmission of electrical power and signals, provide electrical shielding and coolant sealing, and additionally provide mechanical structure between modules 302. Accordingly, the pluggable interface 318 may serve as the distribution, with each individual module 302 comprising the distribution elements. In this way, the distribution is not limited to a maximum number of modules 302.

The system 300 may additionally include module-to-module mechanical interfaces 324 to provide further mechanical structure between the modules 302. Optionally, the modules 302 at the end of the string/row of modules 302 may include a mechanical interface 326 to an external structure. The module 302 at the end of the string in the system 300 may include a termination plug 328 for the cooling system 314, and to provide electrical isolation from the bus (or buses). Each module 302 may include an electrical interface 330 which couples the module 302 to the load and/or source, e.g., transmits the electrical power from the functional segment 306 to the load or source. That is, the electrical interface 330 may be in electrical communication with at least one load or source, such as for example a starter/generator, ground power cart, 400 Hz load, hydraulic loads, etc. Additionally or alternatively, each module 302 may have multiple connections to loads/sources, such that each module 302, via the functional segment 306, is configured to drive multiple loads and/or sources simultaneously.

The system 300 may include a system controller 332 integrally coupled to the plurality of modules 302. The controller 332 may be operable to integrally control the distribution of power across the system 300. Additionally or alternatively, the controller 332 may be configured to control the distribution of coolant via the metering and cutoff valves 316. The controller 332 may include any computing device configured to execute computer-readable instructions. For example, the controller 332 may include a processor (not shown) and a module (not shown). The processor may be integrated with, or separate from, the controller 332. Alternatively, the controller 332 may include various modules, each configured to communicate with the processor via a gateway module. Additionally or alternatively, the system 300 may include multiple controllers, each including a processor and module. The controller 332 may be configured to perform the functions of controller 18, and vice versa, or may otherwise be integrated with controller 18. The controller 332 may be configured to receive various inputs and generate and deliver various outputs in accordance with the inputs received or computer-executable instructions maintained in a database (not shown).

In general, computing systems and/or devices, such as the controller 332 and processor may employ any number of computer operations. It will be apparent to those skilled in the art from the disclosure that the precise hardware and software of the controller 332 and processor may be any combination sufficient to carry out the functions of the examples discussed herein. Controller 332 may be configured to receive input from various sensors and sensor systems, including but not limited to, coolant flow, electrical current, motor/generator 20, 36 output, load/source demands, etc. The controller 332 may be operable to control and manage the function of various components of the system 300 in response to detected sensor input.

The controller 332 may be in communication with the plurality of modules 302 via interfaces (not shown). The interfaces may include an input/output system configured to transmit and receive data from the respective components. The interfaces may be one-directional such that data may only be transmitted in one direction, e.g., from the controller 332 to a module 302. Alternatively, the interfaces may be bi-directional, allowing both receiving and transmitting data between the components.

The controller 332 may be in communication with the fault isolation circuitry 312, 322. The controller 332 may monitor the electrical current, via current sensors (not shown), and if the output exceeds or otherwise triggers a threshold value, the controller 332 may trip switch 312 and/or 322. The controller 332 may be configured to periodically check if the breaker/switch 312, 322 has been tripped and re-enable the breaker/switch 312, 322 to see if the fault still exists. Consequently, the controller's 332 management over the fault isolation circuitry 312, 322 may eliminate module 302 disconnects caused by source or load transients.

The controller 332 may communicate with the health monitoring and prognostics (HMP) system 24, 40 to quantify, via a memory or database, the number and location of faults, and the electrical current associated with each fault. If a module 302 faults or otherwise fails, the controller 332 may isolate or disconnect the module 302 until later service (e.g., by disconnecting the circuitry via switch 312 and/or 322). The stackable or pluggable design of the system 300 enables easy substitution/replacement of the faulty or malfunctioning modules 302 without having to sacrifice the performance or life of the healthy modules 302.

Additionally, the controller 332 may be configured to divert power to a secondary module 302 in response to detecting a fault in a primary module 302. The controller 332 may switch in a module 302 as a substitute to provide electrical power to a load or source if the primary module 302 fails. That is, a module 302 driving non-critical loads/sources may be switched in to take over for the module 302 that fails. For example, with reference to FIG. 3A, if the module 302 labeled 1 is the primary power distribution module 302 for a load, such as 270 V DC load, and faults or otherwise fails, the controller 332 may direct the module 302 labeled 3 (or the module 302 labeled 2, or others such as N) to provide the necessary electrical power required for the 270 V DC load. As such, the controller 332 integrates the plurality of modules 302 to thereby optimize power distribution, thus eliminating the complexity of dedicated converters, inverters, and rectifiers.

The controller 332 may monitor and regulate the thermal energy dispersed across the system 300. The controller 332 may be configured to control the flow of coolant between and within each module 302 via the cooling system 314. For example, the controller 332 may regulate the flow of coolant to each module 302 by actuating the valves 316 between 100% open and 100% closed in response to increased operating temperature or work. Additionally, the controller 332 may be configured to increase/decrease coolant flow to modules 302 in response to the modules 302 differing in temperature in relation to one another past a threshold differential. For example, if one module 302 is operating at a higher temperature in relation to the other modules 302, the controller 332 may increase the coolant flow to that module 302 until the temperature decreases below the threshold. The controller 332 may operate together with controller 18 and thermal management systems 26, 42 to increase/decrease coolant to one or more modules 302 in response changed operating temperatures.

The system 300 illustrated in FIG. 3A and 3B can serve as a standard platform which may be customized/tailored to fit the requirements of a given engine. The pluggable interface 318 allows for easy substitution and replacement of the modules 302. Accordingly, the system 300 may be formatted based on specific load requirements or demands. For example, the configuration of modules 302 having particular functional segments 306 (e.g., DC-AC inverter, AC-DC rectifier, DC-DC converter, etc.) may be based on estimated/predicted operating conditions and/or mission requirements. Likewise, they system 300 configuration may be based on determined load requirements over multiple missions. An aircraft, for instance, which undergoes extreme thrust and aerial maneuvers may require a different configuration of modules 302 having a specific functional segment 306 over an aircraft engine which undergoes steady acceleration and consistent cruise speeds. However, the platform for both types of engines may be the same, with differing configurations of the modules 302.

Advantageously, the pluggable interface 318 removes the necessity of an enclosure (e.g., a chassis or cabinet) to house the individual modules 302 as was required for traditional designs. Mechanical structure is achieved through the pluggable interface 318 and optionally the mechanical interfaces 324 and 326. As such, the number of modules 302 included in system 300 is not limited to the size of the cabinet or limited to pre-allocated number of modules 302 because there is no enclosure, thus expandability is easily achieved. Consequently, mass and volume savings are achieved because the extra enclosure is not required to contain the converter and distribution elements. Similarly, cost is reduced due to the elimination of excess materials such as the enclosure.

Each module 302 may be operable to perform variable power sharing to provide power to the electrical loads and/or sources. The modules 302 may be configured to provide electrical power in parallel equally, or in different proportions to one another (e.g., 75% : 25%). Indeed, two or more modules 302 may be stacked in parallel and connected simultaneously to a load or source so that electrical power can be shared between the modules 302. For instance, two modules 302 configured to supply 50 kW each may provide power in tandem to a 100 kW load. Similarly, multiple modules 302 may be operable to supply electrical power to a common source such as a starter/generator. Additionally or alternatively, the modules 302 may be configured to perform multiple functions or supply multiple loads and/or sources individually. A module 302 may be configured to supply a variety of loads/sources at different times, or may be configured to supply power to multiple loads and/or sources simultaneously. For example, a module 302 may be operable to power to a hydraulic load and a 400 Hz load simultaneously. Similarly, a module 302 may be configured to drive a load (e.g., 270 V DC load, 100 kW load, etc.) and a source (e.g., generator, ground power cart, etc.) simultaneously. As such, fewer modules 302 than the number of loads and sources may be used without the system 300 suffering from mass or volume penalties because one module may have dual roles.

Computing devices such as system 10 generally include computer-executable instructions such as the instructions of the system controller 18, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, C#, Objective C, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A modular power electronics distribution system, comprising:
    a plurality of modules connectable to a pluggable interface, the interface configured to receive and distribute power to the plurality of modules;
    wherein the plurality of modules each include:
        at least one fault isolation switch;
        a coolant system including an inlet and return line, and a metering valve;
        at least one power bus configured to provide electrical power to at least one of a load or source via a functional segment, wherein the functional segment is operable to supply electrical power in a desired form to the load; and a controller in communication with the plurality of modules, the controller configured to control at least one of the at least one fault isolation switch and metering valve.

2. The system as claimed in claim 1, wherein the controller is further configured to manage the distribution of power between the plurality of modules in response to detected load requirements.

3. The system as claimed in claim 1, wherein the controller is configured to detect a fault in response to electrical current tripping the fault isolation switch of at least one module and direct another module to supply power to a load in substitution of the faulty module.

4. The system as claimed in claim 1, further comprising a second fault isolation switch arranged in a segment opposite the at least one fault isolation switch relative to the functional segment such that the functional segment can be isolated on both sides.

5. The system as claimed in claim 1, wherein the functional segment includes at least one of a rectifier, an inverter, and a converter, wherein the at least one of the rectifier, inverter, and converter is one of uni-directional and bi-directional capable.

6. The system as claimed in claim 1, wherein at least two modules can supply power to at least one of a common load or a common source.

7. The system as claimed in claim 1, wherein at least one module can supply power to at least one of multiple loads, multiple sources, or at least one load and one source.

8. An electrical power and thermal management system, comprising:
   at least one motor/generator operable to provide power to a bus system;
   a power electronics distribution system coupled to the at least one motor/generator, the power electronics distribution system comprising:
      a modular pluggable interface configured to augment distribution of power and coolant;
      a plurality of modules configured to mate with the interface, wherein each module includes:
         at least one fault isolation switch;
         a coolant system configured to circulate coolant through an inlet line and a return line, wherein the coolant system includes a metering valve;
         at least one power bus configured to deliver power to a functional segment, wherein the functional segment is operable to supply an appropriate electrical power to at least one of a load or a source; and
      a distribution controller operable to control the fault isolation switch and metering valve.

9. The system as claimed in claim 8, wherein the controller is further configured to control the distribution of power between the plurality of modules.

10. The system as claimed in claim 9, wherein at least one module can supply power to at least one of at least two loads, at least two sources, or at least one load and one source.

11. The system as claimed in claim 9, wherein at least two modules supply power to at least one of a common load or a common source.

12. The system as claimed in claim 8, wherein the power electronic distribution system further comprises a second fault isolation switch arranged opposite the first fault isolation switch relative to the functional segment such that the functional segment can be isolated on both sides.

13. The system as claimed in claim 8, wherein the controller is configured to detect a fault in response to tripping the fault isolation switch of at least one module, disconnect the at least one faulty module, and direct another module to supply supplemental power to a load in lieu of the at least one faulty module.

14. The system as claimed in claim 8, wherein the pluggable interface provides electrical shielding and coolant sealing for the distribution of power and coolant between modules.

15. A method of operating a modular power electronics distribution system, comprising:
   distributing power through a plurality of modules coupled to a pluggable interface, each module including:
      at least one fault isolation switch;
      a coolant system configured to circulate coolant through an inlet line and return line, wherein the coolant system includes a metering valve;
      at least one power bus configured to deliver power to a functional segment;
   monitoring the flow of coolant through the coolant system via the metering valve and detecting an electrical fault via the fault isolation switch; and
   providing electrical power to at least one of a load or source via the functional segment.

16. The method as claimed in claim 15, further comprising disconnecting at least one module in response to detecting the electrical fault and substituting another module to provide power to the load.

17. The method as claimed in claim 15, further comprising, after detecting the electrical fault in response to a tripped fault isolation switch, periodically re-enabling the fault isolation switch.

18. The method as claimed in claim 15, wherein providing electrical power includes at least two modules providing variable electrical power to at least one of a common load or a common source.

19. The method as claimed in claim 15, wherein at least one module is operable to provide electrical power to at least one of multiple loads, multiple sources, or at least one load and one source.

20. The method as claimed in claim 15, wherein the pluggable interface is configured to provide electrical shielding and coolant sealing for the distribution of power between the plurality of modules.

* * * * *